United States Patent
Wee

(10) Patent No.: US 6,362,640 B1
(45) Date of Patent: Mar. 26, 2002

(54) DESIGN OF IC PACKAGE TEST HANDLER WITH TEMPERATURE CONTROLLER FOR MINIMIZED MAINTENANCE

(75) Inventor: Boon Hee Wee, Singapore (SG)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/603,233

(22) Filed: Jun. 26, 2000

(51) Int. Cl.[7] ............................................... G01R 31/02
(52) U.S. Cl. ..................... 324/760; 324/765; 324/158.1; 165/80.1; 165/80.2; 165/80.3; 165/80.4
(58) Field of Search ................................ 324/760, 765, 324/158.1; 165/80.1, 80.2, 80.3, 80.4; 219/209; 361/688, 689, 699, 702

(56) References Cited

U.S. PATENT DOCUMENTS 6,111,421 A * 8/2000 Takahashi et al. ........... 324/760
6,144,215 A * 11/2000 Maxwell et al. ............. 324/765
6,147,506 A * 11/2000 Ahmad et al. ............... 324/760

* cited by examiner

Primary Examiner—Safet Metjahic
Assistant Examiner—Jimmy Nguyen
(74) Attorney, Agent, or Firm—Monica H. Choi

(57) ABSTRACT

An IC package test handler is designed for minimized maintenance. The IC package test handler includes a test handler housing comprised of a thermal insulating material for carrying a chilled water jacket. A test handler base cartridge that is replaceable is mounted to a bottom of the test handler housing and contacts an IC package when the IC package test handler is holding the IC package to a socket of an IC package test station. The test handler base cartridge is comprised of a thermally conductive material and includes a heating element and a temperature sensor embedded therein. A cylinder piston is disposed on top of the chilled water jacket. A temperature controller decreases an amount of compressed air provided to the cylinder piston to retract the cylinder piston away from the chilled water jacket such that the chilled water jacket does not contact the test handler base cartridge, and controls the heating element to heat up the test handler base cartridge, to increase the temperature of the IC package when the temperature at the IC package as sensed by the temperature sensor is below a desired temperature. Alternatively, the temperature controller increases an amount of compressed air provided to the cylinder piston to extend the cylinder piston toward the chilled water jacket such that the chilled water jacket contacts the test handler base cartridge, and controls the heating element to turn off, to decrease the temperature of the IC package when the temperature at the IC package as sensed by the temperature sensor is above the desired temperature.

15 Claims, 7 Drawing Sheets

DESIGN OF IC PACKAGE TEST HANDLER WITH TEMPERATURE CONTROLLER FOR MINIMIZED MAINTENANCE

TECHNICAL FIELD

The present invention relates generally to test systems for IC (integrated circuit) packages, and more particularly, to a low maintenance design of an IC package test handler having a chilled water jacket for controlling the temperature at the IC package.

BACKGROUND OF THE INVENTION

During manufacture of IC (integrated circuit) packages, the IC packages are tested for proper functionality, as known to one of ordinary skill in the art of IC package manufacture. Referring to FIG. 1A, an IC package test handler 100 of the prior art holds an IC package 102 to a test station such that a plurality of leads, including a first lead 104, a second lead 106, a third lead 108, a fourth lead 110, and a fifth lead 112, contact a socket of the test station, as known to one of ordinary skill in the art of IC package manufacture. An IC package typically has more numerous leads in an array of leads, but five leads 104, 106, 108, 110, and 112 are shown in FIG. 1A for clarity of illustration. The IC package test handler 100 includes a sponge 114 for sealing in a vacuum suction for holding the IC package 102.

During testing of the IC package 102 at the socket of the test station, the integrated circuit within the IC package 102 dissipates power during operation, and the IC package 102 heats up. However, during testing of the IC package 102, a predetermined temperature may be desired at the IC package 102. In addition, with excessive heating of the IC package 102, the testing circuitry of the test station may be damaged.

Thus, the IC package test handler 100 includes a heating element 116 for heating the IC package 102 and a chilled water jacket 118 for cooling the IC package 102. The chilled water jacket 118 is filled with chilled water that is circulated through the chilled water jacket 118. Chilled water flows into the chilled water jacket 118 through a chilled water inlet hose 120. Water becomes heated within the chilled water jacket 118, and this heated water is disposed out from the chilled water jacket 118 through a heated water outlet hose 122 such that chilled water constantly circulates through the chilled water jacket 118.

The chilled water jacket 118 is disposed within a test handler housing 124 which is comprised of aluminum in the prior art IC package test handler 100. The heating element 116 is embedded within a test handler base 126 of the test handler housing 124, and the test handler base 126 is integral with the test handler housing 124 in the prior art IC package test handler 100. A temperature sensor 128 is also embedded within the test handler base 126.

A first extension spring is comprised of a first extension spring portion 130 and a second extension spring portion 131. Referring to FIGS. 1A and 1B, the first extension spring portion 130 is wound around a first screw 132, and the second extension spring portion 131 is wound around a second screw 133. The portion of the first extension spring between the first extension spring portion 130 and the second extension spring portion 131 is wound around a first hose fitting 134. The first hose fitting 134 is disposed within the chilled water inlet hose 120 for directing chilled water into the chilled water jacket 118.

A second extension spring is comprised of a third extension spring portion 135 and a fourth extension spring portion 136. Referring to FIGS. 1A and 1C, the third extension spring portion 135 is wound around a third screw 137, and the fourth extension spring portion 136 is wound around a fourth screw 138. The portion of the second extension spring between the third extension spring portion 135 and the fourth extension spring portion 136 is wound around a second hose fitting 139. The second hose fitting 139 is disposed within the heated water outlet hose 122 for directing heated water out of the chilled water jacket 118. The first hose fitting 134 and the second hose fitting 139 are coupled to the chilled water jacket 118 and support the chilled water jacket 118.

In the prior art IC package test handler 100, an extending membrane 142 is stretched over the chilled water jacket 118. A compressed air inlet 144 provides compressed air above the extending membrane 142 such that the extending membrane 142 extends down to push down the chilled water jacket 118.

During operation of the prior art IC package test handler 100, when the temperature at the IC package 102 as sensed by the temperature sensor 128 is below a desired temperature, the amount of compressed air through the compressed air inlet 144 is decreased such that the extending membrane 142 is retracted back and not pushing down the chilled water jacket 118. In that case, the chilled water jacket 118 does not contact the test handler base 126. In addition, for raising the temperature at the IC package 102 to the desired temperature, the heating element 116 embedded in the test handler base 126 is turned on to heat up the test handler base 126. The heated test handler base 126 which contacts the IC package 102 in turn heats up the IC package 102.

On the other hand, referring to FIG. 2, when the temperature at the IC package 102 as sensed by the temperature sensor 128 is above a desired temperature, the amount of compressed air through the compressed air inlet 144 is increased such that the extending membrane 142 extends down to push down the chilled water jacket 118 to contact the test handler base 126. The chilled test handler base 126 which contacts the IC package 102 in turn cools down the IC package 102. In addition, for lowering the temperature at the IC package 102 to the desired temperature, the heating element 116 embedded in the test handler base 126 is turned off.

In this manner, the temperature at the IC package 102 is controlled using feedback control. However, the prior art IC package test handler 100 may require highly skilled labor and cost for maintenance. For example, the extending membrane 142 is stretched uniformly across the test handler housing 124 for proper operation of the IC package test handler 100. If the extending membrane 142 has a loose area, then the compressed air may further extend only that loose area of the extending membrane 142 such that the chilled water jacket 118 is not uniformly pushed down properly onto the test handler base 126.

In addition, because the test handler housing 124 of the prior art is comprised of aluminum, heat is transferred easily through the test handler housing 124, and the heating element 116 does not efficiently heat up the test handler base 126. Furthermore, when the heating element 116 is heated with current flowing through the heating element 116, when the insulating material surrounding the heating element 116 wears down, the heating element 116 may electrically short with the test handler housing 124 comprised of aluminum such that the heating element 116 no longer functions properly.

Additionally, because the test handler base 126 is integral with the test handler housing 124, when a component of the test handler base 126 is inoperative, the whole IC package test handler 100 is dismantled to fix the test handler base 126. Such a process is time-consuming, and renders the whole IC package test handler 100 inoperative while the test handler base 126 is being fixed.

Also, the first extension spring portion 130, the second extension spring portion 131, the third extension spring portion 135, and the fourth extension spring portion 136 are extended and wound around the screws 132, 133, 137, and 138 and around the hose fittings 134 and 139 with a proper amount of extension force for proper operation of the IC package test handler 100 of the prior art. The extension spring portions 130, 131, 135, and 136 are extended with a proper amount of extension force such that the chilled water jacket 118 does not contact the test handler base 126 when the extending membrane 142 is not extending down and such that the chilled water jacket 118 does contact the test handler base when the extending membrane 142 is extending down.

If the extension spring portions 130, 131, 135, and 136 are extended with an improper amount of extension force, the chilled water jacket 118 may not be supported properly. For example, if the extension spring portions 130, 131, 135, and 136 are extended with too much extension force, portions of the chilled water jacket 118 may improperly not contact the test handler base 126 when the extending membrane 142 is extending down. On the other hand, if the extension springs portions 130, 131, 135, and 136 are extended with too little extension force, portions of the chilled water jacket 118 may improperly contact the test handler base 126 when the extending membrane is not extending down. In addition, the extension springs portions 130, 131, 135, and 136 are extended uniformly such that the chilled water jacket 118 is supported evenly for proper operation of the IC package test handler 100 of the prior art. Thus, skilled labor may be required for proper installation of the extension springs in the IC package test handler 100 of the prior art.

Thus, a design of an IC package test handler for minimized maintenance is desired.

SUMMARY OF THE INVENTION

Accordingly, in a general aspect of the present invention, an IC package test handler, for holding an IC package to a socket of an IC package test station, is designed for minimized maintenance.

In one embodiment of the present invention, the IC package test handler includes a test handler housing for caring a chilled water jacket. The test handler housing is comprised of a thermal insulating material, and chilled water circulates through the chilled water jacket. A test handler base cartridge is mounted to a bottom of the test handler housing, and the test handler base cartridge contacts the IC package when the IC package test handler is holding the IC package to the socket of the IC package test station. The test handler base cartridge is comprised of a thermally conductive material. The test handler base cartridge includes a heating element embedded within the test handler base cartridge for heating up the test handler base cartridge. The test handler base cartridge also includes a temperature sensor embedded in the test handler base cartridge, and the temperature sensor contacts the IC package to sense a temperature at the IC package when the IC package test handler is holding the IC package to the socket of the IC package test station.

A cylinder piston is disposed on top of the chilled water jacket, and compressed air from a compressed air source is provided to the cylinder piston such that the cylinder piston pushes the chilled water jacket down toward the test handler base cartridge. An IC package temperature controller is coupled to the temperature sensor, the heating element within the test handler base cartridge, and the compressed air source. The temperature controller controls the compressed air source to decrease an amount of the compressed air provided to the cylinder piston to retract the cylinder piston away from the chilled water jacket such that the chilled water jacket does not contact the test handler base cartridge, and controls the heating element to heat up the test handler base cartridge, to increase the temperature of the IC package when the temperature at the IC package as sensed by the temperature sensor is below a desired temperature. Alternatively, the temperature controller controls the compressed air source to increase an amount of the compressed air provided to the cylinder piston to extend she cylinder piston toward the chilled water jacket such that the chilled water jacket contacts the test handler base cartridge, and controls the heating element to turn off, to decrease the temperature of the IC package when the temperature at the IC package as sensed by the temperature sensor is above the desired temperature.

In this manner, a cylinder piston is used instead of the extending membrane for pushing down the chilled water jacket against the test handler base cartridge. The cylinder piston simply may be dropped into a cavity for proper operation of the IC package test handler. In addition, because the test handler housing is comprised of a thermally insulating material which does not readily conduct heat, the heating element within the test handler base cartridge efficiently heals up the IC package.

The present invention may be used to particular advantage when the test handler base cartridge is coupled to the bottom of the test handler housing by a plurality of screws. Thus, the test handler base cartridge is replaceable by another test handler base cartridge that may be on-hand such that the IC package test handler may be used while a faulty test handler base cartridge is being fixed.

Furthermore, a plurality of compression springs are disposed within the test handler housing and disposed below the chilled water jacket. The compression springs are compressed down when the chilled water jacket is pushed down by the cylinder piston toward the test handler base cartridge, and the compression springs push the chilled water jacket back up away from the test handler base cartridge when the cylinder piston retracts away from the chilled water jacket. These compression springs are simply dropped into cavities internal to the test handler housing.

These and other features and advantages of the present invention will be better understood by considering the following detailed description of the invention which is presented with the attached drawings.

Figure 1A:
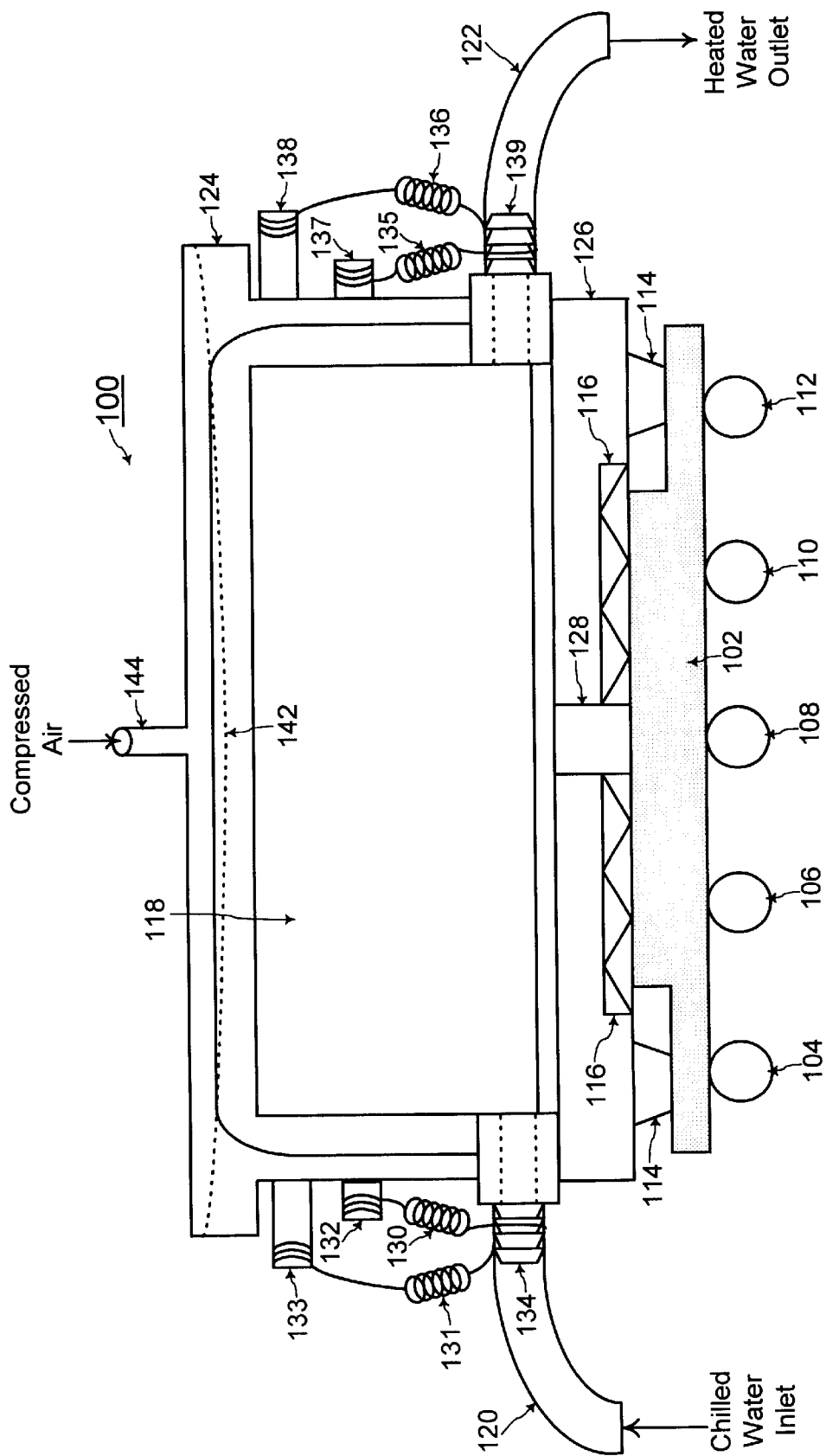
FIG. 1A shows a cross sectional view of a IC package test handler of the prior art having a chilled water jacket that is not extending down to contact a test handler base.
Figure 1B:
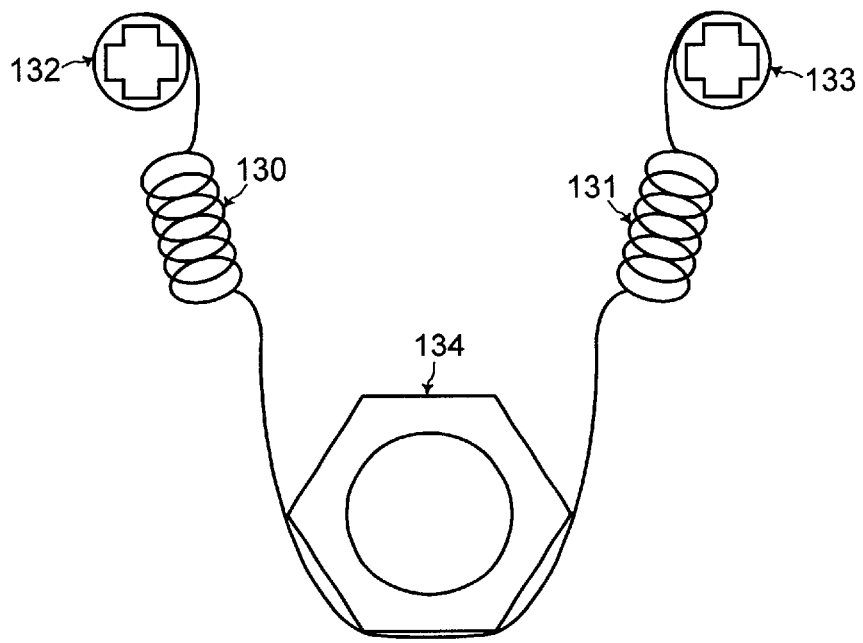
FIG. 1B shows a detailed view of a first extension spring wound around a plurality of screws and a first hose fitting coupled t the chilled water jacket of FIG. 1A for supporting the chilled water jacket.
Figure 1C:
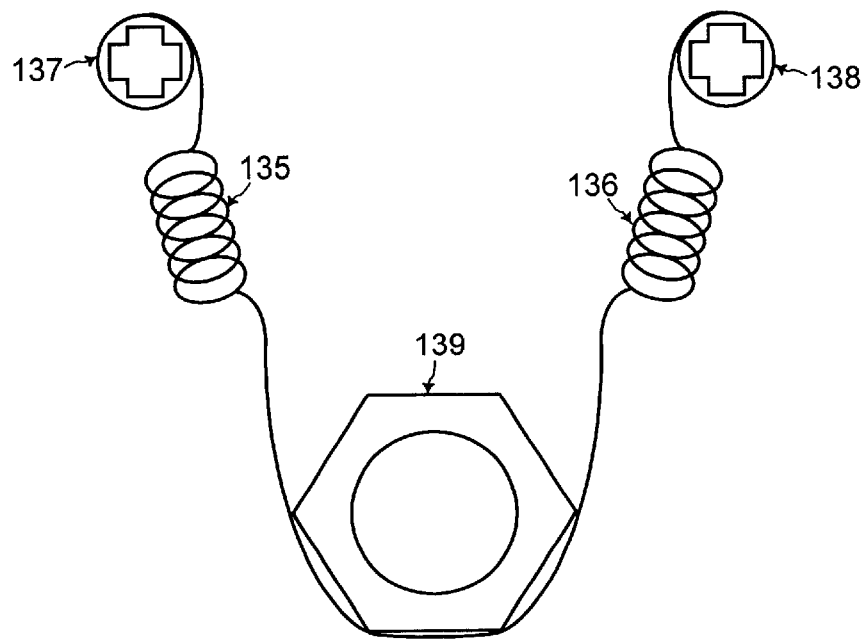
Figure 2:
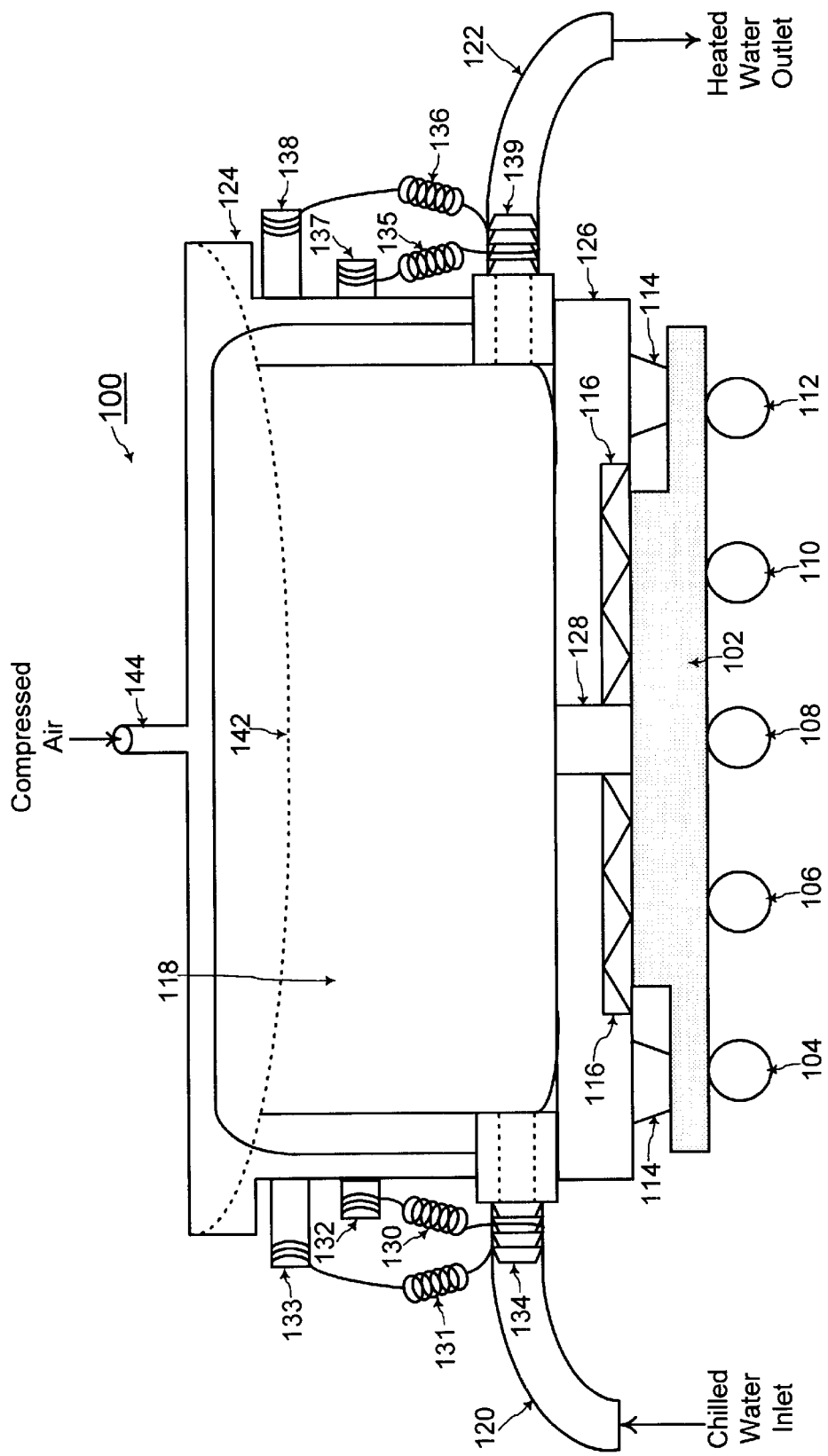
Figure 3:
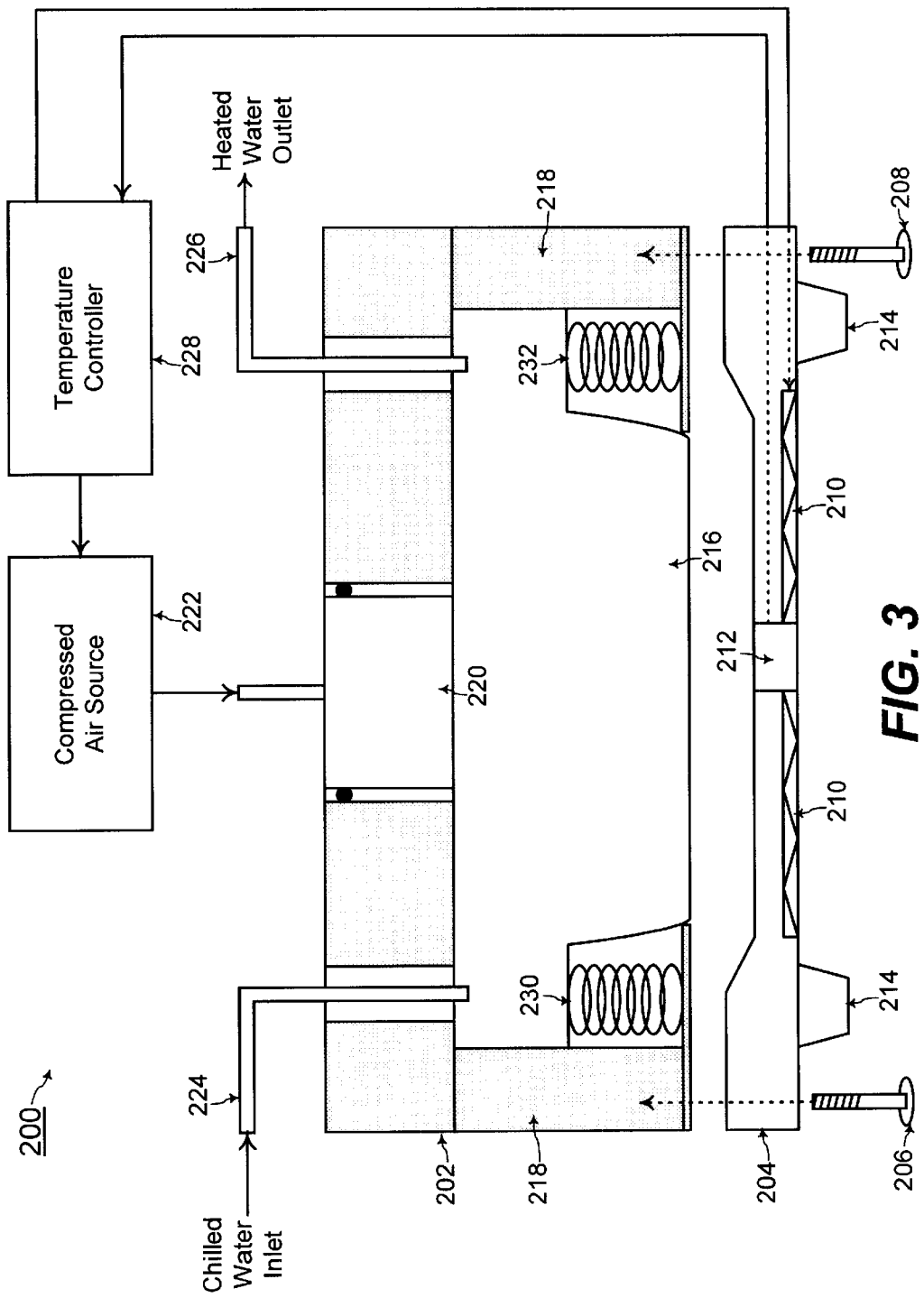
Figure 4:
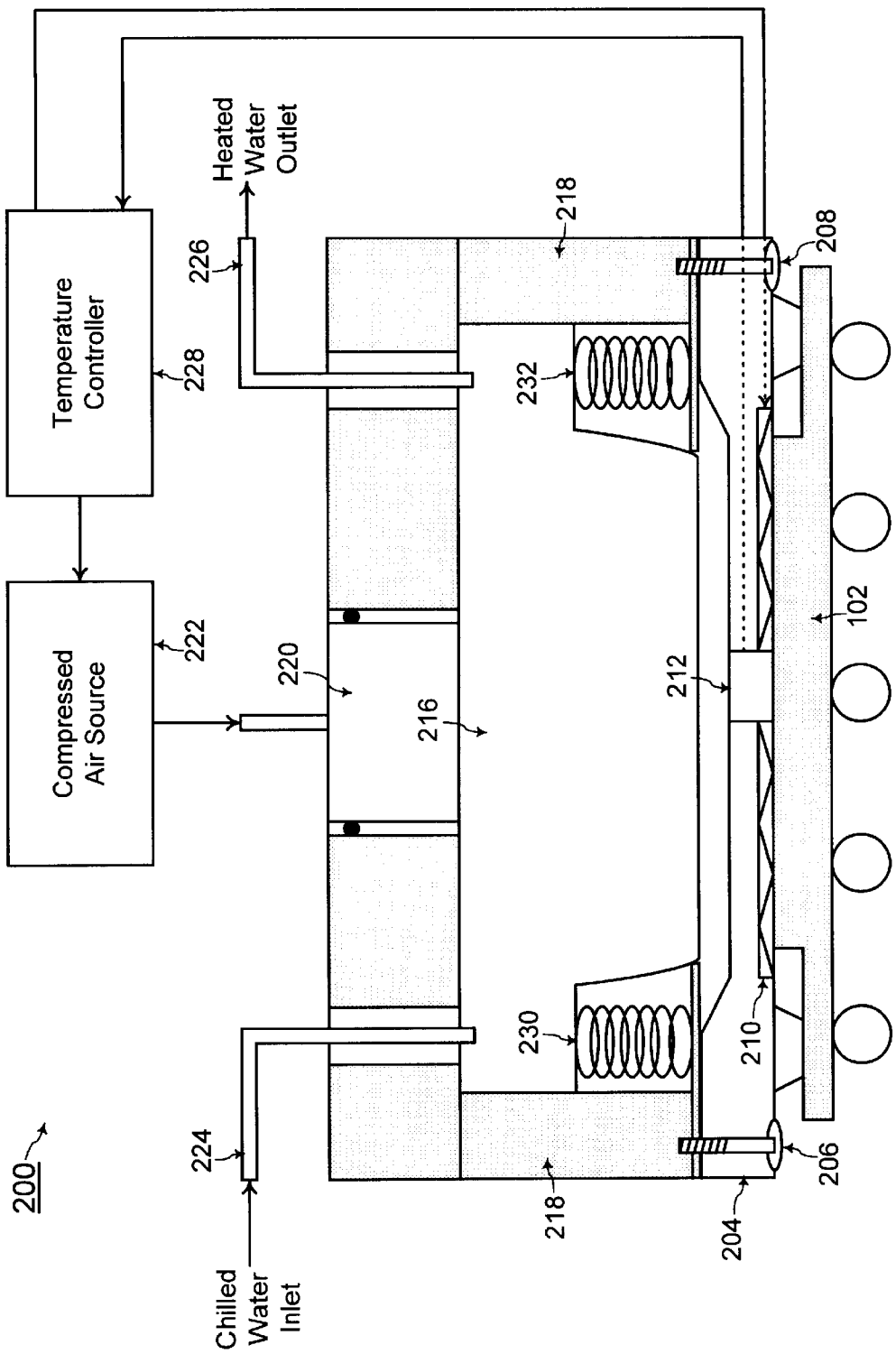
Figure 5:
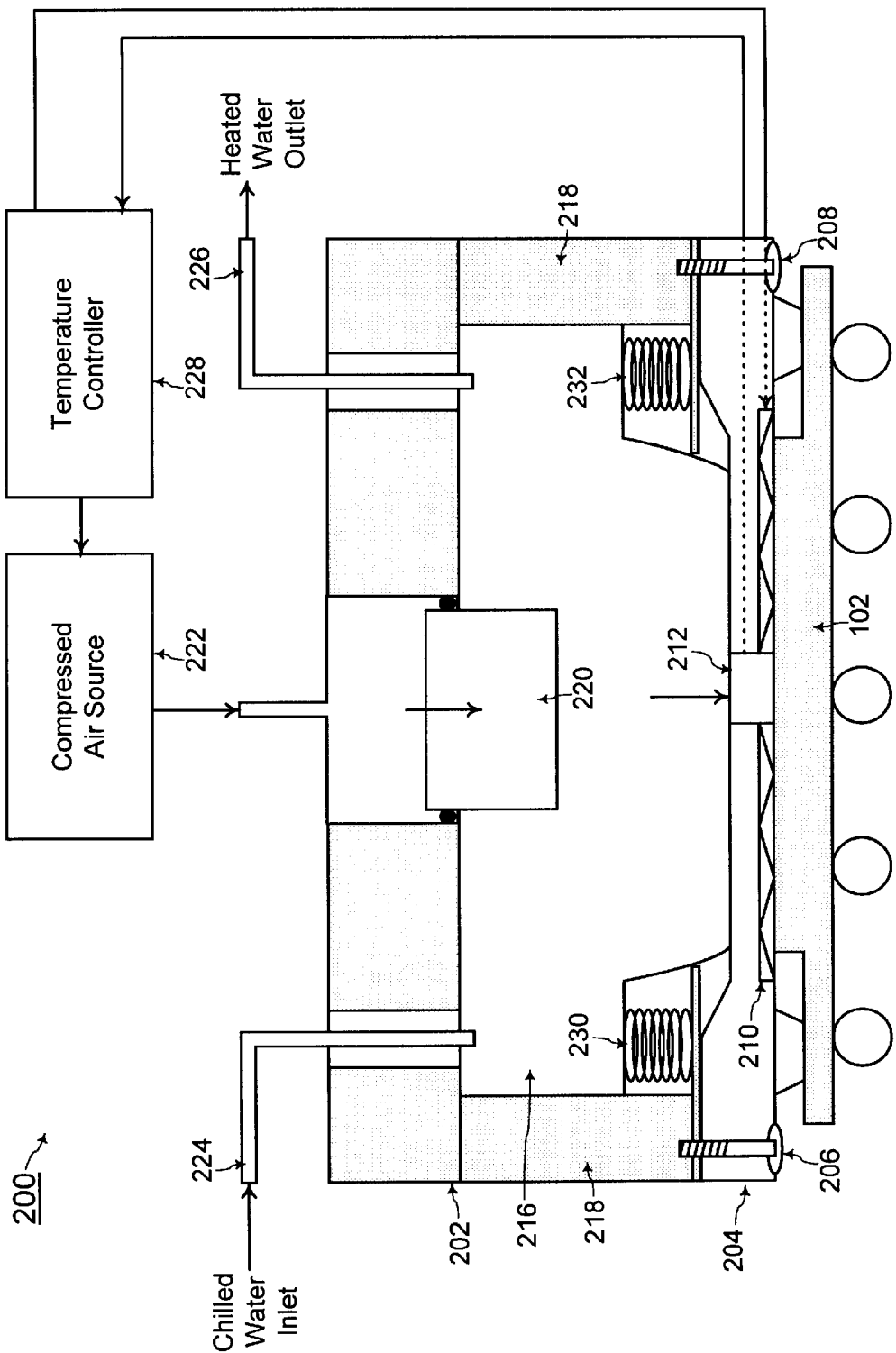
Figure 6:
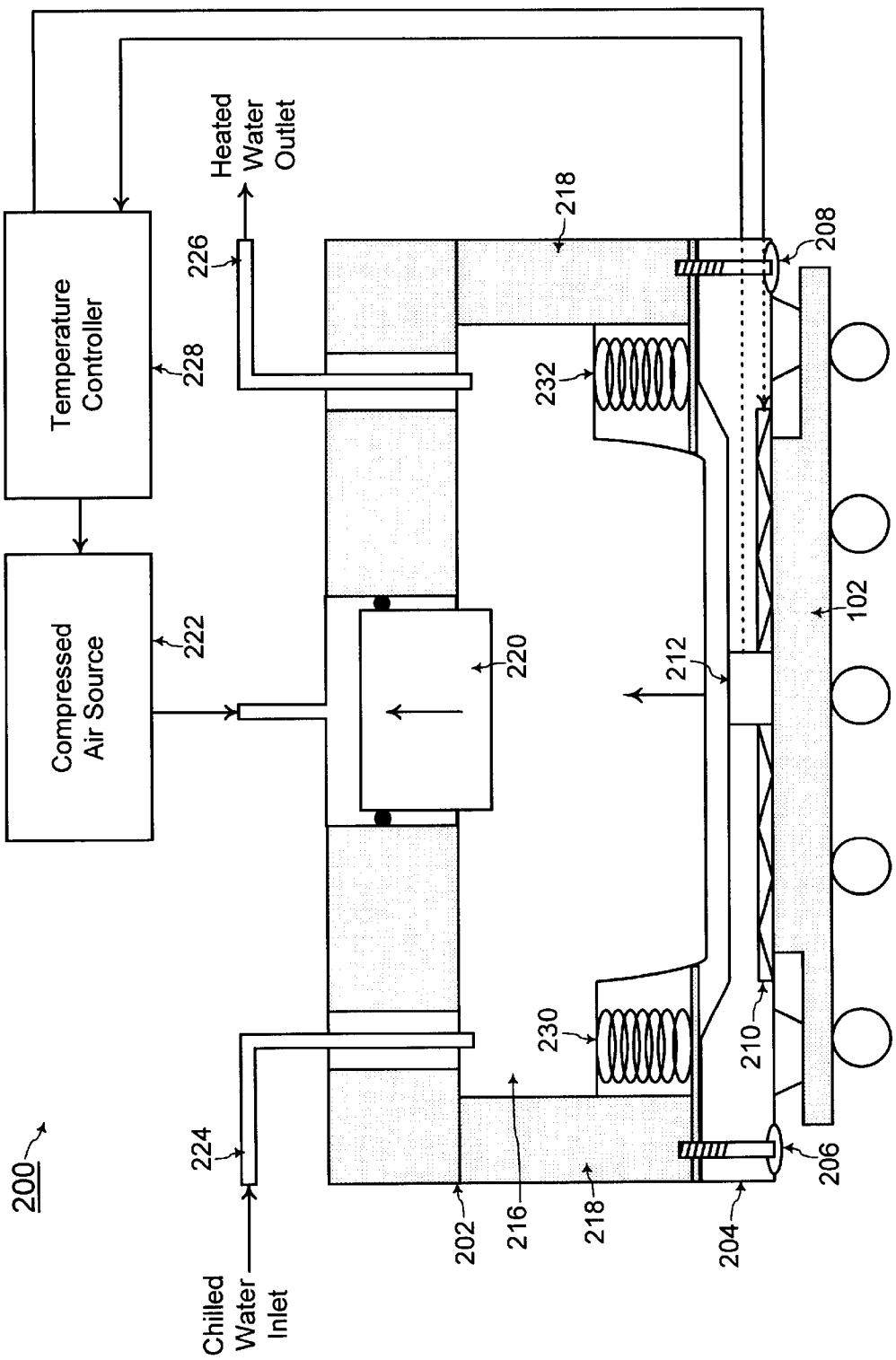

FIG. IC shows a detailed view of a second extension spring wound around a plurality of screws and a second hose fitting coupled to the chilled water jacket of FIG. 1A for supporting the chilled water jacket;

FIG. 2 shows a cross sectional view of the IC package test handler of the prior art of FIG. 1A with the chilled water jacket extending down to contact the test handler base;

FIG. 3 shows a cross sectional view of an IC package test handler having a cylinder piston for pushing the chilled water jacket down to contact a test handler base cartridge, for low maintenance according to an embodiment of the present invention;

FIG. 4 shows a cross sectional view of the IC package test handler of FIG. 3 holding a IC package with the chilled water jacket not extending down to contact the test handler base cartridge, according to an embodiment of the present invention;

FIG. 5 shows a cross sectional view of the IC package test handler of FIG. 3 with the chilled water jacket extending down to contact the test handler base cartridge, according to an embodiment of the present invention; and FIG. 6 shows a cross sectional view of the IC package test handler of FIG. 3 during retraction of the cylinder piston such that the chilled water jacket does not extend down to contact the test handler base cartridge, according to an embodiment of the present invention.

The figures referred to herein are drawn for clarity of illustration and are not necessarily drawn to scale. Elements having the same reference number in FIGS. 1A, 1B, 1C, 2, 3, 4, 5, and 6 refer to elements having similar structure and function.

DETAILED DESCRIPTION

Referring to FIG. 3, in an IC (integrated circuit) package test handler 200 designed for minimized maintenance, a test handle housing 202 is separate from a test handler base cartridge 204. During operation of the IC package test handler 200, the test handler base cartridge 204 is mounted to the bottom o the test handler housing 202 with a plurality of screws 206 and 208. Four screws may b used for mounting the test handler base cartridge 204 to the bottom of the test handler housing 202, but two screws 206 and 208 are shown in FIG. 3 for clarity of illustration.

The test handler base cartridge 20 has a heating element 210 embedded therein and a temperature sensor 212 embedded therein. Heating elements such as high resistance devices which heat up when conduct g current are known to one of ordinary skill in the art of electronics. In addition, temperature sensors such as thermocouples which sense the temperature of an object in contact are known to one of ordinary skill in the art of electronics.

The test handler base cartridge 204 also includes a sponge 214 disposed on the bottom of the test handler base cartridge 204 for sealing in the vacuum suction when holding an IC package as similarly described for the IC package test handler 100 of FIG. 1A of the prior art. The test handler base cartridge 204 of FIG. 3 is comprised of a thermally conductive material such as aluminum for example.

Further referring to FIG. 3, the lest handler housing 202 carries a chilled water jacket 216. The test handler housing 202 is comprised of a thermally insulating material such as a thermal plastic material. In addition, the thermal plastic material of the test handler housing 202 provides ESD (electro static discharge) protection. Such thermal plastic materials are commercially available and are known to one of ordinary skill in the art of IC package testing systems.

The test handler housing 202 in s a bushing 218 disposed within the test handler housing 202 and around the chilled water jacket 216. The bushing 218 is fitted around the chilled water jacket 216 and guides the vertical movement of the chilled water jacket 216. Bushing mechanisms are known to one of ordinary skill in the art of mechanics.

A cylinder piston 220 is dispose[ o]n top of the chilled water jacket 216 and is coupled to a compressed air source 222. The compressed air source 222 provides an amount of compressed air to the cylinder 220 for controlling the up and down movement of the cylinder piston 220. Cylinder piston mechanisms are known to one of ordinary skill in the art of mechanics.

Chilled water is circulated through the chilled water jacket 216. A chilled water inlet 224 is disposed at the top of the test handler housing 202 for providing chilled water to the chilled water jacket 216. Water within the chilled water jacket 216 may become heated, and a heated water outlet 226 is disposed at the top of the test handler housing 202 for disposing heated water from the chilled water jacket 216. In this manner, chilled water is constantly circulated through the chilled water jacket 216 to maintain the temperature at the chilled water jacket 216 at a relatively low temperature.

A temperature controller 228 is coupled to the temperature sensor 212, the heating element 210, and the compressed air source 222. The temperature controller 228 may be comprised of any type of data processing device as known to one of ordinary skill in the art of electronics.

A first compression spring 230 and a second compression spring 232 are disposed within the test handler housing 202 an are disposed below portions of the chilled water jacket 216. Compression springs are commercially available and are known to one of ordinary skill in the art of mechanics.

Referring to FIG. 4, during operation of the IC package test handler 200, the test handler base cartridge 204 is mounted to the bottom of the test handler housing 202 with the plurality of screws 206 and 208. When the IC package 102 is held to a socket of a test station by the IC package test handler 200, the IC package 102 is held to contact the test handler base cartridge 204 using vacuum suction that is sealed by the sponge 214. Vacuum suction mechanisms that use a(sponge for sealing in the vacuum suction are known to one of ordinary skill in the art of IC package test systems.

During operation of the IC package test handler 200, the temperature at the IC package 102 is sensed by the temperature sensor 212. The temperature sensor 212 is coupled to the temperature controller 228 that monitors the temperature at the IC package 102. When the temperature at the IC package 102 as sensed by the temperature sensor 212 is below a desired temperature, the temperature controller 228 controls the compressed air source 222 and the heating element 210 to raise the temperature at the IC package 102. The temperature controller 228 controls the compressed air source 222 to decrease the amount of compressed air provided to the cylinder piston 220 such that the cylinder piston 220 does not push down on the chilled water jacket 216. The chilled water jacket 216 in turn does not contact the test handler base cartridge 204.

In addition, the temperature controller 228 controls the heating element 210 to turn on to heat up the test handler base cartridge 204. Since the chilled water jacket 216 does not contact the test handler base cartridge 204, the test handler base cartridge 204 heats up from the heating element 210 turning on. The heated test handler base cartridge 204 which contacts the IC package 102 in turn heats up the IC package 102 to raise the temperature at the IC package 102 to the desired temperature.

Alternatively, referring to FIG. 5, when the temperature at the IC package 102 as sensed by the temperature sensor 212 is above the desired temperature, the temperature controller 228 controls the compressed air source 222 and the heating element 210 to lower the temperature at the IC package 102. The temperature controller 228 controls the compressed air source 222 to increase the amount of compressed air provided to the cylinder piston 220 such that the cylinder piston 220 pushes down on the chilled water jacket 216. The bushing 218 surrounding the chilled water jacket 216 guides the vertical movement of the chilled water jacket 216. The chilled water jacket 216 in turn contacts the test handler base cartridge 204 to cool down the test handler base cartridge 204.

In addition, the temperature controller 228 controls the heating element 210 to turn off. Since the chilled water jacket 216 contacts the test handler base cartridge 204 and since the heating element 210 is turned off, the cooled test handler base cartridge 204 which contacts the IC package 102 in turn cools down the IC package 102 to lower the temperature at the IC package 102 to the desired temperature. Referring to FIG. 5, when the cylinder piston 220 is lowered to push down on the chilled water jacket 216, the compression springs 230 and 232 are compressed down as the chilled water jacket 216 pushes down on the compression spring 230 and 232.

Referring to FIG. 6, when the temperature at the IC package 102 decreases to below the desired temperature, the temperature controller 228 again controls the compressed air source 222 and the heating element 210 to raise the temperature at the IC package 102. The amount of compressed air provided to the cylinder piston 220 from the compressed air source 222 is decreased such that the cylinder piston 220 retracts back up. In turn, the chilled water jacket 216 retracts back up no longer contact the test handler base cartridge 204. The temperature controller controls the heating element 210 to turn on to heat up the test handler base cartridge 204 and in turn the IC package 102. As the chilled water jacket 216 retracts back up, he compression springs 230 and 232 extend back up to further push the chilled water jacket 216 back up away from the test handler base cartridge 204.

In this manner, the temperature at the IC package 102 is maintained substantially near the desired temperature with feedback control by the temperature controller 228. In addition, the IC package test handler 200 of FIGS. 3, 4, 5, and 6 is a low maintenance system in contrast to the IC package test handler 100 of FIGS. 1 and 2 of the prior art. In the IC package test handler 200 of one embodiment of the present invention, the cylinder piston 220 is simply dropped into the cavity of the cylinder piston mechanism, as known to one of ordinary skill in the art of mechanics. In contrast, the extending membrane 142 of the prior art may require extensive skilled labor in properly fitting the extending membrane 142 to be uniformly stretch within the test handler housing 124 of the prior art.

Furthermore, the test handler housing 202 of the IC package test handler 200 of one embodiment of the present invention is comprised of a thermally insulating material such as thermal plastic to insulate the heat generated by the heating element 210 such that the heating element 210 may efficiently heat up the IC package 102.

Additionally, the test handler base cartridge 204 is separate from the test handler housing 202 such that the test handler base cartridge 204 is readily dismounted from the test handler housing 202 via the screws 206 and 208. If any component of the test handler base cartridge 204 such as the heating element 210 or the temperature sensor 212 is inoperative, then another test handler base cartridge is at hand to replace the inoperative test handler base cartridge 204. In this manner, the IC package test handler 200 may be rendered operative within the time required for replacing the inoperative test handler base cartridge 204 with another test handler base cartridge.

The compression springs 230 and 232 are simply dropped into cavities within the test handler housing 202. Thus, skilled labor is not required in installing the compression springs 230 and 232 to the test handler housing 202 (in contrast to the extension spring portions 130, 131, 135, and 136 of the prior art IC package test handler 100 which may require skilled labor in winding the extension spring portions 130, 131, 135, and 136 around the screws 132, 133, 137, and 138 end around the hose fittings 134 and 139 with proper extension force).

The foregoing is by way of example only and is not intended to be limiting. For example, the present invention is illustrated for an example IC package. The present invention may be used with any other types of IC packages, as would be apparent to one of ordinary skill in the art of integrated circuit manufacture from the description herein. In addition, the material of any structure specified herein is by way of example only.

Furthermore, as will be understood by those skilled in the art, the structures described herein may be made or user in the same way regardless of their position and orientation. Accordingly, it is to be understood that terms and phrases such as "top," "on," and "bottom" as used herein refer to relative location and orientation of various portions of the structures with respect to one another, and are not intended to suggest that any particular absolute orientation with respect to external objects is necessary or required.

The present invention is limiter only as defined in the following claims and equivalents thereof.

I claim:

1. An IC (integrated circuit) package test handler for holding an IC (integrated circuit) package to a socket of an IC (integrated circuit) package test station, the IC package test handler comprising:

a test handler housing for carrying a chilled water jacket, wherein said test handler housing is comprise of a thermal insulating material, and wherein chilled water circulates through said chilled water jacket;

a test handler base cartridge that is mounted to a bottom of said test handler housing, wherein said test handler base cartridge contacts said IC package when said IC package test handler is holding said IC package to said socket of said IC package test station, said test handler base cartridge being comprised of a thermally conductive material, and said test handler base cartridge comprising:

a heating element embedded within said test handler base cartridge for heating up said test candler base cartridge; and a temperature sensor embedded in said test handler base cartridge, wherein said temperature sensor contacts said IC package to sense a temperature at said IC package when said IC package test handler is holding said IC package said socket of said IC package test station;

a cylinder piston dispose on top of said chilled water jacket, wherein compressed air from a compressed air source is provided to said cylinder piston such that said cylinder piston pushes said chilled water jacket down toward said test handler base cartridge; and an IC package temperature controller coupled to said temperature sensor, said heating element within said test handler base cartridge, and said compressed air source;

wherein said temperature controller controls said compressed air source to decrease an amount of said compressed air provided to said cylinder piston to retract said cylinder piston away from said chilled water jacket such that said chilled water jacket does not contact said test handler base cartridge, and wherein said temperature controller controls said heating element to heat up said test handler base cartridge, to increase said temperature of said IC package when said temperature at said IC package as sensed by said temperature sensor is below a desired temperature;

and wherein said temperature controller controls said compressed air source to increase an amount of said compressed air provided to said cylinder piston to extend said cylinder piston toward said chilled water jacket such that said chilled water jacket contacts said test handler base cartridge, and wherein said temperature controller controls said heating element to turn off, to decrease said temperature of said IC package when said temperature at said IC package as sensed by said temperature sensor is above said desired temperature.

2. The IC package test handler of claim 1, wherein said test handler base cartridge is mounted to said bottom of said test handler housing by a plurality of screws, and wherein said test handler base cartridge is replaceable by another test handler base cartridge.

3. The IC package test handler of claim 1, wherein said thermally conductive material of said test handler base cartridge is aluminum.

4. The IC package test handler of claim 1, wherein said test handler housing is comprised of a thermal plastic material that provides ESD (electro static discharge) protection.

5. The IC package test handler of claim 1, further comprising:
a compression spring disposed within said test handler housing and disposed below said chilled water jacket, wherein said compression spring is compressed down when said chilled water jacket is pushed down by said cylinder piston toward said test handler base cartridge, and wherein said compression spring pushes said chilled water jacket away from said test handler base cartridge when said cylinder piston retracts away from said chilled water jacket.

6. The IC package test handler of claim 1, further comprising:
a bushing disposed within said test handler housing and disposed around said chilled water jacket for guiding vertical movement of said chilled water jacket as said cylinder piston pushes down on said chilled water jacket and as said cylinder piston retracts away from said chilled water jacket.

7. The IC package test handler of claim 1, further comprising:
a chilled water inlet disposed at a top of said test handler housing for providing chilled water to said chilled water jacket; and
a heated water outlet disposed at said top of said test handler housing for disposal of heated water from said chilled water jacket.

8. An IC (integrated circuit) package test handler for holding an IC (integrated circuit) package to a socket of an IC (integrated circuit) package test station, the IC package test handler comprising:

a test handler housing for carrying a chilled water jacket, wherein said test handler housing is comprised of a thermal plastic material that provides ESD (electro static discharge) protection, and wherein chilled water circulates through said chilled water jacket;

a test handler base cartridge that is mounted to a bottom of said test handler housing, wherein said test handler base cartridge contacts said IC package when said IC package test handler is holding said IC package to said socket of said IC package test station, said test handler base cartridge being comprised of aluminum, and said test handler base cartridge comprising:
a heating element embedded within said test handler base cartridge for heating up said test handler base cartridge; and
a temperature sensor embedded in said test handler base cartridge, wherein said temperature sensor contacts said IC package to sense a temperature at said IC package when said IC package test handler is holding said IC package to said socket of said IC package test station;

wherein said test handler base cartridge is mounted to said bottom of said test handler housing by a plurality of screws, and wherein said test handler base cartridge is replaceable by another test handler base cartridge;

a cylinder piston disposed on top of said chilled water jacket, wherein compressed air from a compressed air source is provided to said cylinder piston such that said cylinder piston pushes said chilled water jacket down toward said test handler base cartridge;

an IC package temperature controller coupled to said temperature sensor, said heating element within said test handler base cartridge, and said compressed air source;

wherein said temperate controller controls said compressed air source to decrease an amount of said compressed air provided to said cylinder piston to retract said cylinder piston away from said chilled water jacket such that said chilled water jacket does not contact said test handler base cartridge, and wherein said temperature controller controls said heating element to heat up said test handler base cartridge, to increase said temperature of said IC package when said temperature at said IC package sensed by said temperature sensor is below a desired temperature;

and wherein said temperature controller controls said compressed air source to increase an amount of said compressed air provided to said cylinder piston to extend said cylinder piston toward said chilled water jacket such that said chilled water jacket contacts said test handler base cartridge, and wherein said temperature controller controls said heating element to turn off, to decrease said temperature of said IC package when said temperature at said IC package as sensed by said temperature sensor is above said desired temperature;

a compression spring disposed within said test handler housing and disposed below said chilled water jacket, wherein said compression spring is compressed down when said chilled water jacket is pushed down by said cylinder piston toward said test handler base cartridge, and wherein said compression spring pushes said chilled water jacket away from said test handler base cartridge when said cylinder piston retracts away from said chilled water jacket;

a bushing disposed within said test handler housing and disposed around said chilled water jacket for guiding vertical movement of said chilled water jacket as said cylinder piston pushes down on said chilled water jacket and as said cylinder piston retracts away from said chilled water jacket;

a chilled water inlet disposed at a top of said test handler housing for providing chilled water to said chilled water jacket; and a heated water outlet disposed at said top of said test handler housing for disposal of heated water from said chilled water jacket.

9. A method for holding IC (integrated circuit) package to a socket of an IC (integrated circuit) package test station while maintaining a temperature at said IC package at a desired temperature, the method including the steps of:

circulating chilled water, through a chilled water jacket disposed within a test handler housing, wherein said test handler housing is comprised of a thermal insulating material;

contacting a test handler base cartridge to said IC package when holding said IC package to said socket of said test station, wherein said test handler base cartridge is mounted to a bottom of said test handler housing, wherein said test handler base cartridge is comprised of a thermally conductive material, and wherein said test handler base cartridge includes a heating element embedded within said test handler base cartridge for heating up said test handler base cartridge;

sensing said temperature at said IC package when holding said IC package to said socket of said test station with a temperature sensor embedded in said test handler base cartridge;

controlling a compression air source to decrease an amount of compressed air provided to a cylinder piston disposed on top of said chilled water jacket such that said cylinder piston retracts away from said chilled water jacket and such that said chilled water jacket does not contact said test handler base cartridge, and controlling said heating element to heat up said test handler base cartridge, to increase said temperature at said IC package when said temperature at said IC package as sensed by said temperature sensor is below a desired temperature; and controlling said compressed air source to increase an amount of said compressed air provided to said cylinder piston to extend said cylinder piston toward said chilled water jacket such that said chilled water jacket contacts said test handler base cartridge, and controlling said heating element to turn off, to decrease said temperature at said IC package when said temperature at said IC package as sensed by said temperature sensor is above said desired temperature.

10. The method of claim 9, further including the step of:

mounting said test handler base cartridge to said bottom of said test handler housing by a plurality of screws; and replacing said test handler base cartridge with another test handler base cartridge when said test handler base cartridge is inoperative.

11. The method of claim 9, wherein said thermally conductive material of said test handler base cartridge is aluminum.

12. The method of claim 9, wherein said test handler housing is comprised of a thermal plastic material that provides ESD (electro static discharge) protection.

13. The method of claim 9, further including the step of:

compressing down a compression spring disposed within said test handler housing and disposed below said chilled water jacket when said chilled water jacket is pushed down by said cylinder piston toward said test handler base cartridge, and wherein said compression spring pushes said chilled water jacket away from said test handler base cartridge when said cylinder piston retracts away from said chilled water jacket.

14. The method of claim 9, further including the step of:

guiding vertical movement of said chilled water jacket within said test handler housing with a bushing disposed within said test handler housing and disposed around said chiller water jacket as said cylinder piston pushes down on said chilled water jacket ant as said cylinder piston retracts away from said chilled water jacket.

15. The method of claim 9, further including the steps of:

providing chilled water to said chilled water jacket through a chilled water inlet disposed at a top of said test handler housing; and disposing heated water from said chilled water jacket through a heated water outlet disposed at said top of said test handler housing.

* * * * *